(12) United States Patent
Kim

(10) Patent No.: US 8,012,838 B2
(45) Date of Patent: Sep. 6, 2011

(54) METHOD FOR FABRICATING LATERAL DOUBLE DIFFUSED METAL OXIDE SEMICONDUCTOR (LDMOS) TRANSISTOR

(75) Inventor: Nam-Joo Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 50 days.

(21) Appl. No.: 12/647,513

(22) Filed: Dec. 27, 2009

(65) Prior Publication Data

US 2010/0173463 A1 Jul. 8, 2010

(30) Foreign Application Priority Data

Jan. 6, 2009 (KR) .................. 10-2009-0000938

(51) Int. Cl.
*H01L 21/336* (2006.01)
(52) U.S. Cl. ...................................... 438/286
(58) Field of Classification Search .................. None
See application file for complete search history.

(56) References Cited

U.S. PATENT DOCUMENTS

| 5,514,608 | A  | * | 5/1996 | Williams et al. | 438/286 |
|-----------|----|---|--------|-----------------|---------|
| 6,310,378 | B1 | * | 10/2001 | Letavic et al. | 257/347 |
| 6,608,336 | B2 | * | 8/2003 | Kikuchi et al. | 257/288 |
| 7,265,416 | B2 | * | 9/2007 | Choi et al. | 257/343 |
| 2009/0253234 | A1 | * | 10/2009 | Lee | 438/151 |
| 2010/0127321 | A1 | * | 5/2010 | Ko | 257/327 |
| 2010/0148254 | A1 | * | 6/2010 | Park | 257/337 |
| 2010/0252882 | A1 | * | 10/2010 | Denison et al. | 257/337 |

* cited by examiner

*Primary Examiner* — Scott B Geyer
(74) *Attorney, Agent, or Firm* — Sherr & Vaughn, PLLC

(57) ABSTRACT

Disclosed is a method for fabricating a lateral double diffused metal oxide semiconductor (LDMOS) transistor, which includes implanting impurity ions onto a semiconductor substrate to form a drift region and a body region, forming a photoresist pattern to expose a region where an insulating oxide film is to be formed on the semiconductor substrate, implanting first impurity ions through the photoresist pattern to form a first impurity region, where the insulating oxide film is to be formed, in the semiconductor substrate, forming an insulating oxide film and an outer insulating oxide film on the semiconductor substrate by an oxidation process, and forming a gate electrode on the semiconductor substrate.

20 Claims, 2 Drawing Sheets

US 8,012,838 B2

Figure 1:
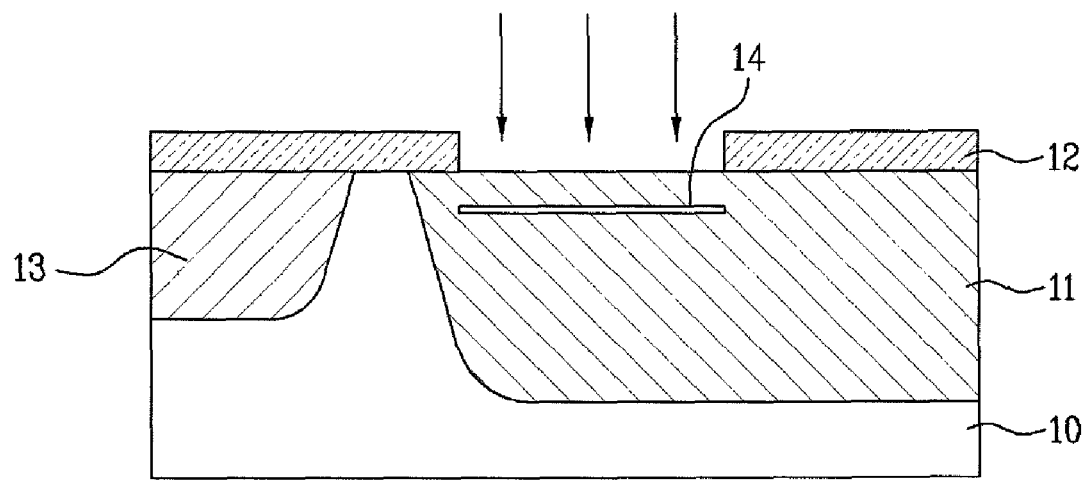

METHOD FOR FABRICATING LATERAL DOUBLE DIFFUSED METAL OXIDE SEMICONDUCTOR (LDMOS) TRANSISTOR

The present application claims priority under 35 U.S.C. §119 to Korean Patent Application No. 10-2009-0000938 (filed on Jan. 6, 2009) which is hereby incorporated by reference in its entirety.

BACKGROUND

The improvement in the level of integration of semiconductor devices, and thus, development in fabrication design techniques thereof have brought about a number of efforts to realize a semiconductor system on a single chip. Such a single chip system has been developed, based on technology to integrate controllers, memories and circuits operating at low voltages into a single chip.

However, to realize low weight and miniaturization of a semiconductor system, it is necessary to integrate a circuit part to control power of the system, i.e., input and output terminals and main functional circuits into a single chip. However, input and output terminals cannot be realized as a low-voltage CMOS circuit, because high voltages are applied thereto. Accordingly, these terminals are generally realized by high-voltage power transistors.

Accordingly, to reduce the size and weight of systems, input/output terminals of a power source and a controller should be integrated into a single chip. A technology to realize this integration is a power IC, which includes a high-voltage transistor circuit and a low-voltage CMOS transistor circuit integrated into a single chip. Such a power IC technology is an improvement of a vertical DMOS (VDMOS) device as a discrete power transistor, which may realize a lateral DMOS (LDMOS) device. In an LDMOS device, a drain is laterally arranged to allow current to laterally flow and a drift region is interposed between a channel and the drain to assure high breakdown voltage.

SUMMARY

Embodiments relate to a semiconductor technique such as a lateral double diffused metal oxide semiconductor (LDMOS) transistor that allows an electric current to smoothly flow from a source to a drain.

In accordance with embodiments, a method for fabricating a lateral double diffused metal oxide semiconductor (LDMOS) transistor can include at least one of the following: implanting impurity ions in a semiconductor substrate to form a drift region and a body region, forming a photoresist pattern to expose a region where an insulating oxide film is to be formed on and/or over the semiconductor substrate, implanting first impurity ions in the semiconductor substrate through the photoresist pattern to form a first impurity region where the insulating oxide film is to be formed, forming an insulating oxide film and an outer insulating oxide film on and/or over the semiconductor substrate by an oxidation process, and forming a gate electrode on and/or over the semiconductor substrate.

In accordance with embodiments, a method for fabricating a lateral double diffused metal oxide semiconductor (LDMOS) transistor can include at least one of the following: simultaneously forming a drift region and a body region by implanting impurity ions into a semiconductor substrate; forming a photoresist pattern over the semiconductor substrate to expose a predetermined region of the semiconductor substrate; forming a first impurity region over the predetermined region by implanting a first impurity ion in the semiconductor substrate through the photoresist pattern; simultaneously forming an insulating oxide film at the predetermined region and an outer insulating oxide film over the semiconductor substrate by an oxidation process; and then forming a gate electrode over the semiconductor substrate.

In accordance with embodiments, a method for fabricating a lateral double diffused metal oxide semiconductor (LDMOS) transistor can include at least one of the following: simultaneously forming a drift region and a body region into a semiconductor substrate; forming a first impurity region over the predetermined region; simultaneously forming an insulating oxide film at the predetermined region and an outer insulating oxide film spaced from the insulating oxide film over the semiconductor substrate; forming a gate electrode over the semiconductor substrate such that one end of the gate electrode extends to the body region and another end of the gate electrode extends over and contacts the insulating oxide film; and then forming a source region and a drain region on the exposed body region and drift region using the gate electrode, the insulating oxide film and the outer insulating oxide film as ion-implantation masks.

In accordance with embodiments, a lateral double diffused metal oxide semiconductor (LDMOS) transistor can include at least one of the following:

DRAWINGS

Example FIGS. 1 to 4 illustrate a method for fabricating a lateral double diffused metal oxide semiconductor transistor, in accordance with embodiments.

DESCRIPTION

Hereinafter, embodiments will be described with reference to the annexed drawings. Although the configurations and functions of embodiments are illustrated in the accompanying drawings and described with reference to the accompanying drawings, the technical idea of embodiments and the important configurations and functions thereof are not limited thereto.

Although most terms used in the present invention have been selected from general ones widely used in the art, some terms have been arbitrarily selected by the applicant and their meanings are explained in detail in the following description as needed. Thus, embodiments should be understood through the intended meanings of the terms rather than their simple names or meanings.

Hereinafter, a lateral double diffused metal oxide semiconductor (LDMOS) transistor to realize a uniform threshold voltage in accordance with embodiments will be described with reference to the annexed drawings.

Example FIGS. 1 to 4 are sectional views illustrating a method for fabricating a lateral double diffused metal oxide semiconductor transistor in accordance with embodiments.

As illustrated in example FIG. 1, impurity ions are implanted in semiconductor substrate 10 made of a monocrystalline silicon layer and defined by an active region and a device-isolating region to form drift region 11 and body region 13. Particularly, n-type impurity ions such as phosphorous ions are implanted at a predetermined dosage over the entire surface of the exposed semiconductor substrate 10 and an impurity-diffusion process is performed at a predetermined temperature for a predetermined period of time to form drift region 11. Subsequently, p-type impurity ions such as boron (B) ions are implanted at a predetermined dosage using a predetermined ion-implantation mask to form body region 13 spaced from drift region 11 by a predetermined distance. A part of p-type body region 13 serves as a channel region.

Then, a photoresist is applied to semiconductor substrate 10, is exposed to light and developed to form photoresist pattern 12 which exposes a region where a field oxide film is formed between a source and a drain of the DMOS to be formed in the subsequent process. Then, nitrogen is implanted using photoresist pattern 12 using an ion-implantation mask to form nitrogen region 14 at a predetermined depth in semiconductor substrate 10. The ion implantation depth of the nitrogen region 14 is determined such that it is arranged below the insulating oxide film, while taking into consideration the thickness of the insulating oxide film to be formed in the subsequent process. Nitrogen region 14 is formed such that the width of nitrogen region 14 is equivalent to that of the bottom of the field oxide film to be formed in the subsequent process.

Figure 2:
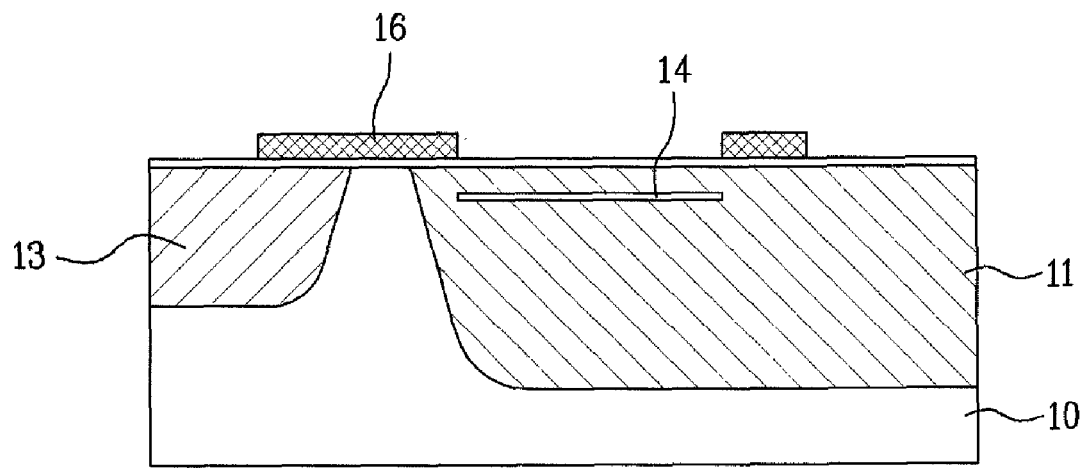

As illustrated in example FIG. 2, in order to form an insulating oxide film, a nitride film is formed on and/or over semiconductor substrate 10 and is patterned to form nitride film pattern 16 that exposes a region where the insulating oxide film is to be formed.

Figure 3:
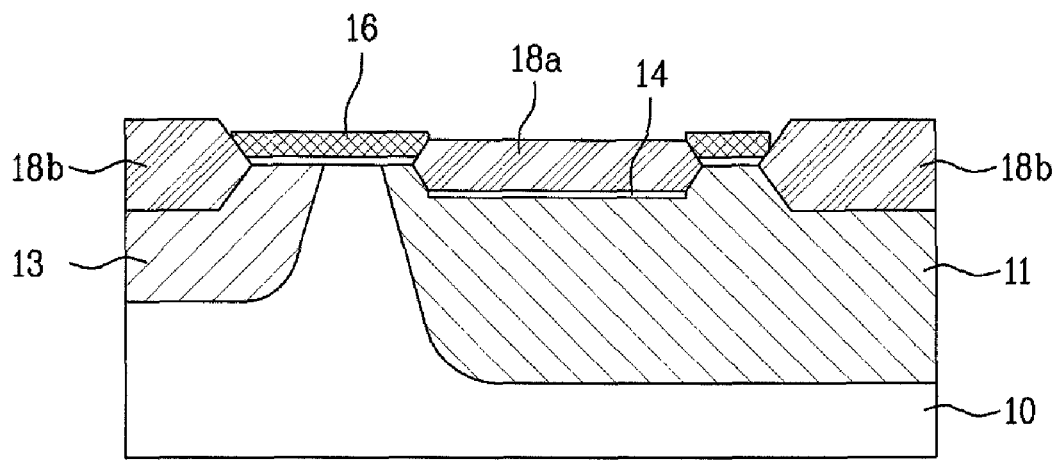

As illustrated in example FIG. 3, an oxidation process is performed on semiconductor substrate 10 exposed by nitride film pattern 16 to form insulating oxide film 18a and outer insulating oxide film 18b simultaneously. At this time, insulating oxide film 18a interposed between the source and the drain to be formed in the subsequent process is formed on and/or over nitrogen region 14 and is spaced from the body region to be formed in the subsequent process by a predetermined distance. In addition, the thickness of insulating oxide film 18a is determined such that it is less than that of outer insulating oxide film 18b, while taking into consideration the depth of nitrogen region 14.

Figure 4:
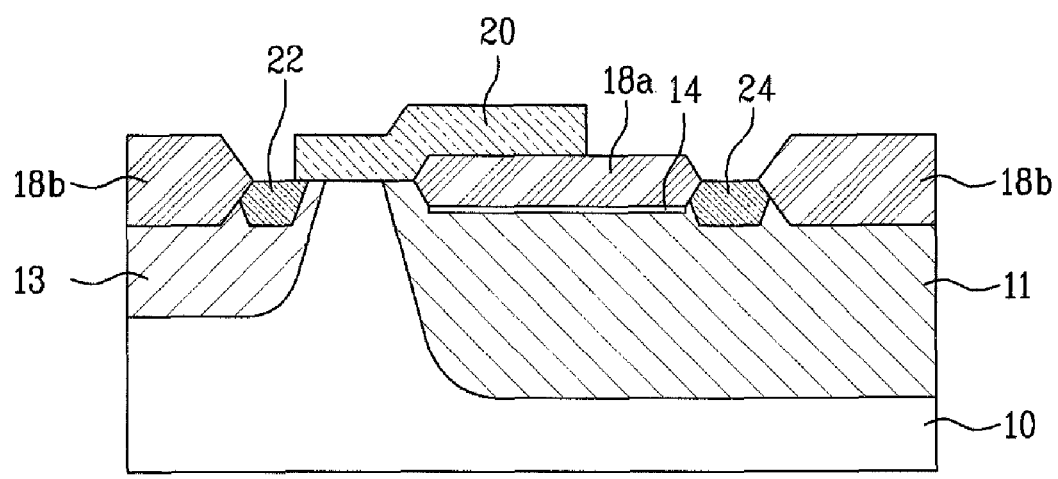

As illustrated in example FIG. 4, after nitride film pattern 16 is removed, a gate-insulating material such as silicon oxide and a gate-forming material such as polysilicon are deposited on and/or over the entire surface of the substrate provided with insulating oxide film 18a and outer insulating oxide film 18b and are then patterned to form a gate pattern including a gate insulating layer and gate electrode 20. One end of gate electrode 20 extends to the surface of body region 13 and the other end thereof extends on and/or over insulating oxide film 18a. Then, N$^+$-type impurity ions are implanted in the exposed body region 13 and drift region 11 using gate electrode 20, insulating oxide film 18a and outer insulating oxide film 18b as ion-implantation masks to form source region 22 and drain region 24 to a predetermined depth.

As apparent from the fore-going, embodiments provide a lateral double diffused metal oxide semiconductor (LDMOS) transistor such that the thickness of an insulating oxide film arranged in a drift region on and/or over a semiconductor substrate can be controlled owing to a nitrogen region arranged under the insulating oxide film, and maintenance in inner pressure and improvement in current flow can thus be realized.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    simultaneously forming a drift region and a body region by implanting impurity ions into a semiconductor substrate;
    forming a photoresist pattern over the semiconductor substrate to expose a predetermined region of the semiconductor substrate;
    forming a first impurity region over the predetermined region by implanting a first impurity ion in the semiconductor substrate through the photoresist pattern;
    simultaneously forming an insulating oxide film at the predetermined region and an outer insulating oxide film over the semiconductor substrate by an oxidation process; and
    forming a gate electrode over the semiconductor substrate.

2. The method of claim 1, wherein the first impurity region is formed by implanting nitrogen.

3. The method of claim 1, wherein the first impurity region is formed such that the first impurity region is arranged under the insulating oxide film.

4. The method of claim 1, wherein the first impurity region is formed such that the width of the first impurity region is equivalent to that of the bottommost surface of the insulating oxide film.

5. The method of claim 1, wherein the insulating oxide film is formed over the first impurity region and is spaced from the body region by a predetermined distance.

6. The method of claim 1, wherein the insulating oxide film is formed such that the insulating oxide film has a thickness less than the thickness of the outer insulating oxide film.

7. The method of claim 1, wherein the thickness of the insulating oxide film is dependent upon the depth of the first impurity region.

8. The method of claim 1, wherein the insulating oxide film is interposed between a source region and a drain region.

9. The method of claim 1, wherein the gate electrode is formed such that one end of the gate electrode extends to the surface of the body region and the other end thereof extends over the insulating oxide film.

10. The method of claim 1, wherein simultaneously forming the insulating oxide film and the outer insulating oxide film comprises:
    forming a nitride film over the semiconductor substrate;
    patterning the nitride film to form a nitride film pattern to expose the predetermined region; and then
    performing an oxidation process on the semiconductor substrate exposed by the nitride film pattern.

11. The method of claim 1, further comprising:
    forming a source region and a drain region on the exposed body region and drift region using the gate electrode, the insulating oxide film and the outer insulating oxide film as ion-implantation masks.

12. The method of claim 1, wherein the predetermined region comprises a region where the insulating oxide film is formed.

13. A method comprising:
    simultaneously forming a drift region and a body region into a semiconductor substrate;
    forming a first impurity region over a predetermined region;
    simultaneously forming an insulating oxide film at the predetermined region and an outer insulating oxide film spaced from the insulating oxide film over the semiconductor substrate;
    forming a gate electrode over the semiconductor substrate, wherein one end of the gate electrode extends to the body region and another end of the gate electrode extends over and contacts the insulating oxide film; and then forming a source region and a drain region on the exposed body region and drift region using the gate electrode, the insulating oxide film and the outer insulating oxide film as ion-implantation masks.

14. The method of claim 13, wherein the first impurity region is formed by implanting nitrogen.

15. The method of claim 13, wherein the first impurity region is formed such that the first impurity region is arranged directly under the insulating oxide film.

16. The method of claim 13, wherein the first impurity region is formed such that the width of the first impurity region is equivalent to the width of the bottommost surface of the insulating oxide film.

17. The method of claim 13, wherein the thickness of the insulating oxide film is dependent upon the depth of the first impurity region.

18. The method of claim 13, wherein the insulating oxide film is interposed between the source region and the drain region.

19. The method of claim 13, wherein simultaneously forming the insulating oxide film and the outer insulating oxide film comprises:
    forming a nitride film over the semiconductor substrate;
    patterning the nitride film to form a nitride film pattern to expose the predetermined region; and then
    performing an oxidation process on the semiconductor substrate exposed by the nitride film pattern.

20. The method of claim 13, wherein the predetermined region comprises a region where the insulating oxide film is formed.

* * * * *